United States Patent
Froment et al.

(10) Patent No.: US 9,276,541 B1
(45) Date of Patent: Mar. 1, 2016

(54) EVENT-BASED PRESENTATION AND PROCESSING OF CONTENT

(71) Applicant: AMAZON TECHNOLOGIES, INC., Reno, NV (US)

(72) Inventors: Arnaud Marie Froment, San Jose, CA (US); Kenneth Paul Kiraly, Menlo Park, CA (US); Jonathan White Keljo, Seattle, WA (US); Srinivasan Sridharan, Sunnyvale, CA (US); Levon Dolbakian, Los Gatos, CA (US); Nadim Awad, San Francisco, CA (US); Michael David Dumont, Sunnyvale, CA (US)

(73) Assignee: Amazon Technologies, Inc., Reno, NV (US)

( * ) Notice: Subject to any disclaimer, the term of this patent is extended or adjusted under 35 U.S.C. 154(b) by 330 days.

(21) Appl. No.: 13/795,299

(22) Filed: Mar. 12, 2013

(51) Int. Cl.
 *H03G 3/20* (2006.01)
(52) U.S. Cl.
 CPC ........................................ *H03G 3/20* (2013.01)
(58) Field of Classification Search
 None
 See application file for complete search history.

(56) References Cited

U.S. PATENT DOCUMENTS

| | | | |
|---|---|---|---|
| 2008/0280653 A1* | 11/2008 | Ma et al. | 455/569.1 |
| 2010/0124336 A1* | 5/2010 | Shridhar et al. | 381/71.4 |
| 2013/0094668 A1* | 4/2013 | Poulsen et al. | 381/107 |
| 2013/0196715 A1* | 8/2013 | Hansson et al. | 455/563 |
| 2013/0223642 A1* | 8/2013 | Warren | H04B 3/00 381/77 |

* cited by examiner

*Primary Examiner* — Regina N Holder
(74) *Attorney, Agent, or Firm* — Lindauer Law, PLLC

(57) ABSTRACT

Content is presented by media devices to a user. Described herein are techniques and systems for determining occurrence of one or more events at, or proximate to, the media device. Once an event is determined, one or more actions to modify presentation of the content may be initiated. The actions may include starting presentation of the content, stopping presentation of the content, applying noise mitigation techniques to the content, and so forth. The noise mitigation techniques may include modification of an intended signal from the content to produce a noise mitigation zone 118 proximate to, or encompassing, at least a portion of the user's head.

20 Claims, 8 Drawing Sheets

EVENT-BASED PRESENTATION AND PROCESSING OF CONTENT

BACKGROUND

Content is presented to a user in a wide variety of situations on a variety of different types of media devices. The media devices may include tablets, smartphones, televisions, laptops, set-top boxes, portable media players, in-vehicle entertainment systems, desktop computers, and so forth.

During presentation, occurrence of various events may impact the user's experience in consuming the content. For example, the environment may be noisy, the user may have been distracted by another person, and so forth.

Figure 1:
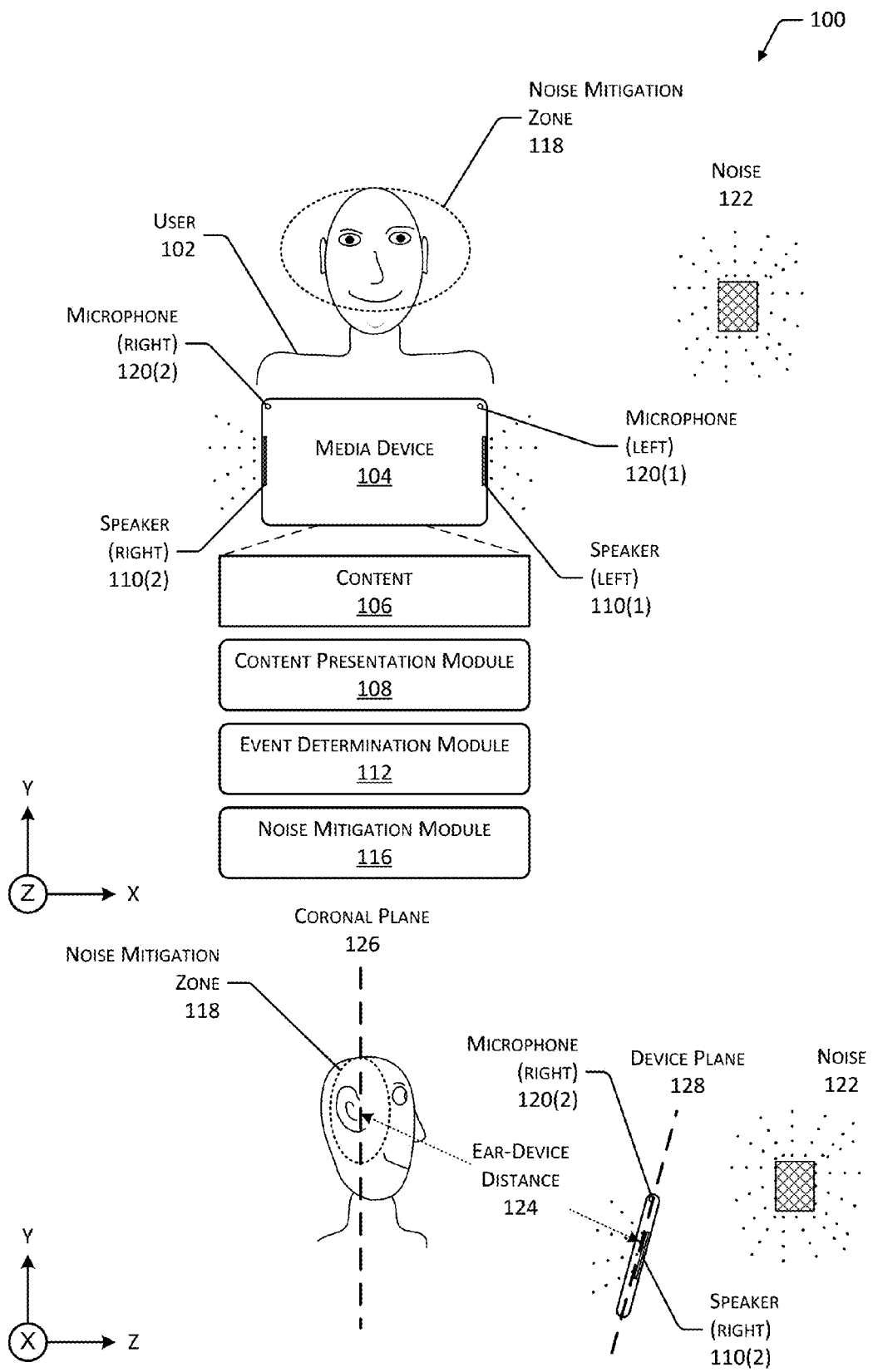
FIG. 1 is an illustrative system for dynamic presentation and processing of content based on events.

Certain implementations and embodiments will now be described more fully below with reference to the accompanying figures, in which various aspects are shown. However, various aspects may be implemented in many different forms and should not be construed as limited to the implementations set forth herein. Like numbers refer to like elements throughout.

DETAILED DESCRIPTION

Media devices such as tablets, smartphones, televisions, and so forth present a variety of content to users. This content may include audio, video, eBooks, applications, and so forth. A user experience while consuming the content may be adversely impacted by events occurring to the media device or in the environment around the media device. These events may include the user turning away from the media device to talk to another person, falling asleep while using the media device, presence of a noise source in the environment, and so forth.

Traditionally the user has manually responded to these events. For example, the user may turn up the volume to try and overcome the noise, or may manually stop presentation of a video before falling asleep. However, the manual actions may be cumbersome or unavailable.

Described in this disclosure are methods and devices for having the media device react automatically to events. The events may be described in terms of, and recognized by, particular inputs received from one or more input devices.

Occurrence of an event may be recognized by the media device. Events such as the user picking up the media device, turning away from the media device, talking with another person, presence of ambient noise, and so forth may be recognized by the media device. Occurrence of one or more events may be used to initiate actions which modify presentation of the content. For example, an event comprising the user turning their face away from the media device and speaking may result in an action of suspending content presentation. The user turning back to face the media device and ceasing to speak may be recognized as another event, and the corresponding action may be to rewind the content slightly and resume presentation. The event recognition and corresponding automatic action may improve the overall user experience by allowing the media device to interact more naturally with the user.

The events may be occurring in the environment around the media device. In one implementation, occurrence of an ambient noise event may result in activation of a noise mitigation module. The noise mitigation module is configure to modify an intended signal comprising audio output from the content to generate a noise mitigation zone which encompasses at least the ears of the user. The noise mitigation zone is based at least in part on the relative position between the user and the media device. An anti-noise signal based on input from a microphone and the position of the user's ears is generated. In one implementation the anti-noise signal is summed with the intended signal to produce an output signal for presentation. In another implementation the anti-noise signal is used to modify audio equalizer settings to process the intended signal, attenuating or amplifying particular frequencies.

With the noise mitigation active, the user perceives the audio of content and a perceived reduction in the noise. This may improve the user experience of consuming the content, with or without the use of headphones.

Illustrative System

FIG. 1 is an illustrative system 100 for dynamic presentation and processing of content based on events. A user 102 is depicted using a media device 104 in both a front view and a side view. While a single user 102 is shown, more than one user 102 may be present.

The media device 104 is configured to present, store, manipulate, or otherwise participate in the consumption of content 106. The media device 104 may include televisions, tablet computers, desktop computers, laptop computers, electronic book ("eBook") readers, gaming consoles, set-top boxes, media players, in-vehicle entertainment systems, portable media players, smartphones, and so forth.

The content 106 may include audio, video, eBooks, applications, games, and so forth. The content 106 may be downloaded or streamed from a content provider to the media device 104.

A content presentation module 108 is configured to present the content 106 using output devices on the media device 104, or coupled to the media device 104. This presentation may include producing audible output using one or more speakers 110, one or more display devices, haptic output devices, and so forth. For example, in this illustration a pair of speakers 110(1) and 110(2) are depicted as mounted within, or affixed to, a chassis of the media device 104. In other implementations additional speakers 110 may be externally located, such as in the case of a surround sound audio system. In one implementation, the speakers may be configured to direct the sound towards the user 102. This directivity may be due to a physical structure or placement of the speakers 110, due to application of beamforming techniques to output from multiple speakers 110, or a combination thereof.

The media device 104 may include an event determination module 112. The event determination module 112 is configured to receive input from one or more input devices and determine an occurrence of one or more events. This determination may include comparing the input with a previously stored event library. An event is an occurrence which is detectable by one or more input devices and which occurs at, or proximate to, the media device 104. Events may include activities of the user 102, such as looking at the media device 104, setting down the media device 104, talking to another person, falling asleep, and so forth. Events may also include other situations such as noise in the environment of the media device 104 which is above a threshold value. Events are discussed in more detail below with regard to FIG. 3.

The event determination module 112 may access the event library. The event library associates particular events with particular actions. The media device 104 may be configured such that upon occurrence of the determined event a particular action is initiated by the media device 104. For example, the event of a user looking away from the media device 104 may be associated with the initiating a low power mode in the media device 104.

As described above, one event which may be determined as occurring is the presence of noise in the environment. This may detract from the user experience of the user 102 by making it more difficult for the user 102 to hear audio associated with the content 106. The event determination module 112 may be configured to determine such an ambient noise event and activate a noise mitigation module 116. The noise mitigation module 116 is configured to use information about a position of the user 102 relative to the media device 104 to modify audio and form a noise mitigation zone 118. The noise mitigation module 116 may use one or more microphones 120 to detect noise 122. Based on the noise 122 and the relative position, an anti-noise signal is generated. The anti-noise signal is then used to generate an output signal which is emitted from the one or more speakers 110. The output signal produces the noise mitigation zone 118. These signals as discussed in more detail below with regard to FIG. 6.

In one implementation the position information used by the noise mitigation module 116 may include an ear-device distance 124. The ear-device distance 124 may be determined using one or more input devices, such as a camera or infrared distance sensor. The media device 104 and the input devices are described below in more detail with regard to FIG. 2.

The ear-device distance 124 may be envisioned as extending from a point on a coronal plane 126 to a point on a device plane 128. The coronal plane 126 is a reference plane which bisects a front half of the user from a back half, with the coronal plane 126 extending through the left and right ear canals of the user. The device plane 128 is a reference plane which may be described in some implementations by the two longest dimensions of the media device 104.

The noise mitigation module 116 may use the ear-device distance 124 and other distances such as those described below with regard to FIG. 5 to generate the anti-noise signal. The output signal, based at least in part on the anti-noise signal, produces the noise mitigation zone 118 proximate to, or encompassing, the ears of the user 102. As a result, the user 102 experiences a perceived decrease in the noise 122 during presentation of the content 106 while the noise mitigation module 116 is active.

The modules may be executed on the media device 104, or on one or more other devices. The other devices, such as a server, may be in communication with the media device 104.

Figure 2:
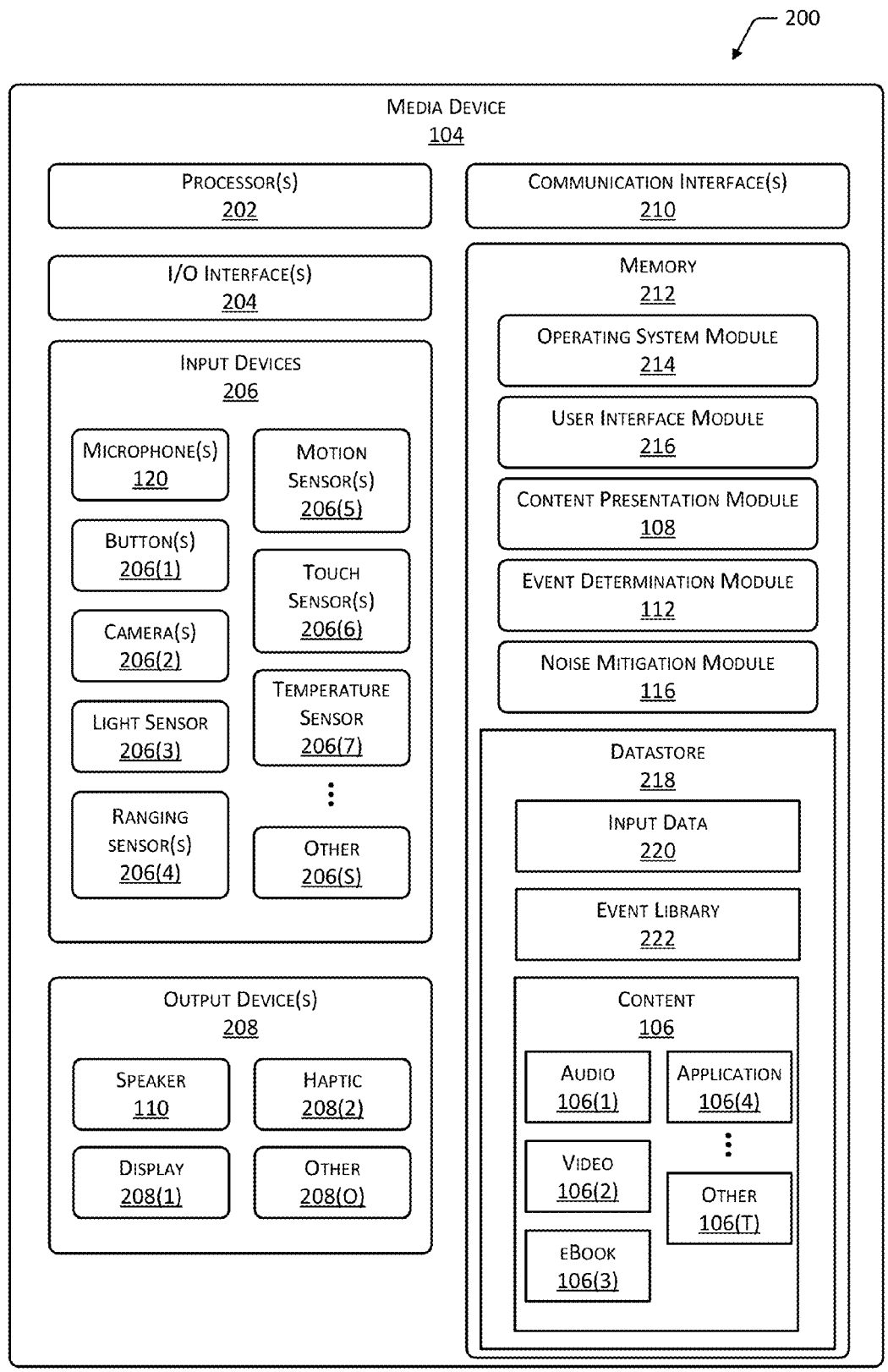
FIG. 2 is a block diagram of a media device configured to dynamically present and process content based at least in part on determined events.

FIG. 2 is a block diagram 200 of the media device 104 configured to dynamically present and process content 106 based at least in part on determined events. The media device 104 may include one or more processors 202 configured to execute one or more stored instructions. The processors 202 may comprise one or more cores. The media device 104 may include one or more input/output ("I/O") interface(s) 204 to allow the processor 202 or other portions of the media device 104 to communicate with other devices. The I/O interfaces 204 may comprise inter-integrated circuit ("I2C"), serial peripheral interface bus ("SPI"), Universal Serial Bus ("USB") as promulgated by the USB Implementers Forum, RS-232, one or more media device interfaces such as High Definition Multimedia Interface ("HDMI") as promulgated by HDMI Licensing LLC, TOSLINK as promulgated by Toshiba Corp., analog video, analog audio, IEEE 1394 as promulgated by the Institute for Electrical and Electronics Engineers, and so forth.

The I/O interface(s) 204 may couple to one or more input devices 206, output devices 208, or both. The input devices 206 may include the one or more of the microphones 120, buttons 206(1), cameras 206(2), light sensors 206(3), ranging sensors 206(4), motion sensors 206(5), touch sensors 206(6), temperature sensors 206(7), or other devices 206(S).

The buttons 206(1) may include a single button, or a keyboard of physical buttons which are activated when the user 102 applies an incident force. In some implementations the buttons 206(1) may be implemented as "soft" buttons, such as a particular area on a touch sensor 206(6).

The cameras 206(2) may include charge coupled devices ("CCDs"), complementary metal oxide ("CMOS"), or other devices to generate images in one or more of infrared, visible, or ultraviolet light. The light sensor 206(3) may be configured to determine ambient lighting. For example, the light sensor 206(3) may comprise a photocell, photodiode, photovoltaic junction, and so forth.

The cameras 206(2) may be configured to determine gaze of the user. In one implementation an infrared illuminator and an infrared ("IR") sensitive camera 206(2) may be used to determine a direction that the user 102 is looking, relative to the media device 104.

The ranging sensors 206(4) are configured to provide distance information from the media device 104 to another object, such as the user 102. The ranging sensors 206(4) may include an optical time-of-flight device, stereoscopic ranging devices, ultrasonic time-of-flight device, proximity sensor either optical, capacitive, or acoustic, structured light system, and so forth. For example, the ranging sensors 206(4) may be used to determine the ear-device distance 124.

The motion sensors 206(5) may be configured to determine one or more of linear motion, rotational motion, orientation, and so forth. The motion sensors 206(5) may include microelectromechanical systems ("MEMS") such as accelerometers, gyroscopes, and so forth. For example, the motion sensors 206(5) may be able to detect the typical tremor motion of the user 102 holding the media device 104, or the user 102 flipping the media device 104 over into a face-down orientation.

The touch sensors 206(5) may include force sensitive resistors, capacitive sensors, optical sensors, acoustic sensors, and so forth. The touch sensors 206(5) may be configured to determine a location of one or more touches.

The temperature sensor 206(7) may be used to determine ambient temperature. The other sensors 206(S) may include, but are not limited to, a clock, a timer, a human cardiac pulse detector, barometric sensor, galvanic skin resistance sensor, and so forth. In some embodiments, the input devices 206, the output devices 208, or both may be physically incorporated with the media device 104 or may be externally placed. As described above, the data from these input devices 206 may be used by the event determination module 112 to determine the occurrence of one or more events. Actions corresponding to these events may then be initiated.

In some implementations the input devices 206 may be part of an external device. For example, the media device 104 may comprise a set-top box with a remote control. The remote control may include one or more of the motion sensors 206(5), touch sensors 206(6), and so forth.

The media device 104 may also include one or more output devices 208. These output devices may include one or more of the speakers 110, display devices 208(1), haptic devices 208(2), or other output devices 208(O). The one or more speakers 110 may include one or more speakers configured to generate sounds in particular ranges such as subwoofers, woofers, midrange, tweeters, super tweeters, and so forth. In some implements, output may be directed to particular speakers 110.

The one or more display devices 208(1) may include electrophoretic displays, liquid crystal displays, interferometric displays, cholesteric displays, light emitting diode displays, projection displays, and so forth.

The haptic devices 208(2) are configured to generate haptic output which is perceived by the user 102 as sensation which is felt. For example, the haptic output may produce a sensation of a particular texture, physical displacement of a switch, vibration, texture, and so forth. The haptic devices 208(2) may include, but are not limited to, piezoelectric devices, artificial muscle, and linear actuators.

The media device 104 may have one or more communication interfaces 210. The communication interfaces 210 are configured to provide communications between the media device 104 and other devices, such as other media devices 104, routers, access points, servers, and so forth. The communication interfaces 210 may be configured to couple to or form personal area networks ("PAN"), wired and wireless local area networks ("LANs"), wide area networks ("WANs"), and so forth. For example, Bluetooth, ZigBee, Ethernet, Wi-Fi, and so forth.

The media device 104 may also include one or more busses or other internal communications hardware or software that allow for the transfer of data between the various modules and components of the media device 104.

As shown in FIG. 2, the media device 104 includes one or more memories 212. The memory 212 comprises one or more computer-readable storage media ("CRSM"). The CRSM may be any one or more of an electronic storage medium, a magnetic storage medium, an optical storage medium, a quantum storage medium, a mechanical computer storage medium and so forth. The memory 212 provides storage of computer readable instructions, data structures, program modules and other data for the operation of the media device 104.

The memory 212 may include at least one operating system (OS) module 214. The OS module 214 is configured to manage hardware resource devices such as the I/O interfaces 204, the I/O devices such as the input devices 206 and the output devices 208, the communication interfaces 210, and provide various services to applications or modules executing on the processors 202. Also stored in the memory 212 may be one or more of the following modules. These modules may be executed as foreground applications, background tasks, daemons, and so forth.

A user interface module 216 is configured to provide a user interface to the user 102 using the output devices 208 and accept inputs received from the input devices 206. The user interface may include one or more visual, audible, or haptic elements. For example, the user interface may be configured to provide a graphic user interface, an audible user interface, and so forth.

As described above in FIG. 1, the media device 104 may store in the memory 212 the content presentation module 108. The content presentation module 108 is configured to present at least a portion of the content 106. This presentation may use one or more of the output devices 208, such as the one or more speakers 110, the one or more displays 208(1), the one or more haptic devices 208(2), and so forth. The presentation of the content 106 may be modified based at least in part by the events determined by the event determination module 112.

As also described above, the event determination module 112 is configured to receive input from the one or more input devices 206 and determine occurrence of one or more events. Based on these events, one or more actions may be initiated. The events corresponding actions are discussed in more detail below with regard to FIG. 3.

The noise mitigation module 116 is configured to generate the noise mitigation zone 118 by modifying the audio portion of the content 106 being presented to the user 102. The noise mitigation module 116 is discussed in more detail below with regard to FIGS. 5-8.

Other modules may also be present. For example, a digital rights management module may provide support for presenting or processing content 106 which is protected using one or more digital rights management schemes.

The memory 212 may also include a datastore 218 to store information. The datastore 218 may use a flat file, database, linked list, tree, or other data structure to store the information. In some implementations the datastore 218, or a portion of the datastore 218, may be distributed across one or more other devices including servers, network attached storage devices and so forth.

Input data 220 comprising information acquired by the one or more input devices 206 may be stored in the datastore 218. The input data 220 may include audio from the one or more microphones 120, information indicative of particular button 206(1) presses, images acquired by the one or more cameras 206(2), and so forth. The input data 220 may be processed by the event determination module 112 and compared with an event library 222 to determine the occurrence of one or more events.

The event library 222 associates particular events with particular actions. For example, the event library 222 may associate the input data 220 indicating a decrease in ambient temperature and ambient light as indicating the occurrence of the event "sleep". The event library 222 is discussed in more detail below with regard to FIG. 3.

The datastore 218 may store the content 106. The content 106 may be stored either in its entirety or a portion. For example, the content 106 may be streamed from a server such that, at any given time, only a portion of the content 106 is stored within the memory 212. The content 106 may include audio 106(1), video 106(2), eBooks 106(3), applications 106(4), or other 106(T) information. For example, the content 106 may include particular haptic sensations.

Figure 3:
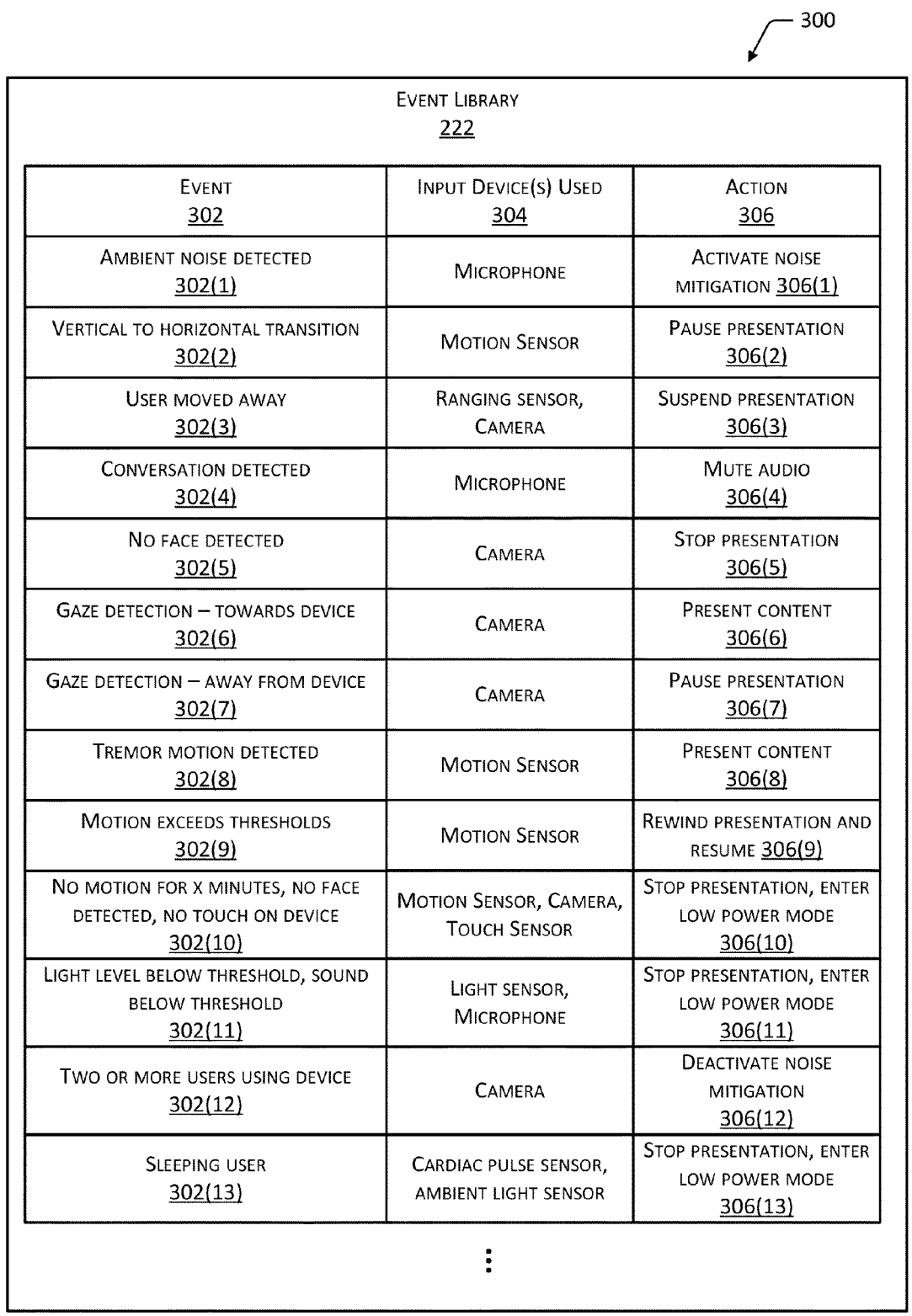
FIG. 3 is a schematic of an event library comprising events, input devices used to gather information about the events, and the actions corresponding to the events.

FIG. 3 is a schematic 300 of the event library 222. The event library 222 comprises one or more events 302. Occurrences of these events 302 are determined by analyzing the input data 220 from one or more input devices used 304. The input data 220 may utilize sensor fusion, that is, the input from different sensors to determine the event 302. For example, output from the light sensor 206(3) may be coupled with images acquired by the camera 206(2) to determine that room lights have been dimmed or extinguished and the user's 102 eyes are closed, indicating the event 302 of "user asleep" as occurred. The events 302 may include motion of the media device 104, detection of the user 102 head facing towards or away from the media device 104 or a portion thereof, the user 102 gazing towards or away from the media device 104 or a portion thereof, ambient light below a threshold value, and so forth.

The events 302 may be associated with one or more actions 306. These one or more actions 306 may be initiated or executed by the event determination module 112 or another module upon detection of the corresponding event 302. For example, an ambient noise detected event 302(1) may be determined based on input data 220 from the one or more microphones 120. The media device 104 may, based on this event 302(1), perform the action 306(1) of activating the noise mitigation module 116.

The event library 222 may include events 302 and actions 306 which are configured to control presentation of content 106. The content 106 may be presented by the content presentation module 108 by playing or executing the content 106. For example, audio content 106(1) and video content 106(2) may be played, particular pages of the eBook content 106(3) may be presented or read aloud by a text-to-speech module, the application content 106(4) may be executed by the one or more processors 202, and so forth.

Presentation may be controlled by initiating or playing the content 106 to start presentation, pausing presentation, stopping or suspending presentation, and so forth. In some implementations, suspending presentation may include stopping or pausing presentation and placing the media device 104 into a low power mode. A point of presentation in the content 106 may be varied by moving forward or backward throughout the content 106, such as with the use of a "fast forward", "rewind", or seek control.

The actions 306 may include use of these controls to change presentation. For example, a no face detected event 302(5) may be based on image data acquired from the camera 206(2). Upon determining the no face detected event 302(5), the corresponding action 306(5) of stopping presentation may be taken. For example, the event determination module 112 may send a notification to the content presentation module 108 to cease presentation of the content 106. In another implementation, the no face detected event 302(5) may have the corresponding action 306(5) of generating a mark indicative of a position within the content 106 which corresponds to a time of occurrence of the event. For example, the user 102 walking away from the device may result in the generation and storage of a bookmark, storage of a frame reference, and so forth, which corresponds to the time during presentation of the content 106 when the user's 102 face disappeared from the view of the camera 206(2). At a later time, the user 102 may then choose to resume presentation at the position within the content 106 which corresponded to the event of walking away, such as by selecting the particular bookmark.

Other events 302 may initiate actions 306 which resume presentation of the content 106. For example, a tremor motion detected 302(8) event may use the one or more motion sensors 206(5) to receive input data 220 indicative of the normal tremors experienced by the user 102 when holding the media device 104. These tremors may be due to involuntary muscle movements, cardiac activity, and so forth. Based on this input data 220, the event determination module 112 determines the tremor motion detected 302(8) and initiates a rewind and present content action 306(8). Continuing the example, the event determination module 112 may send a notification to the content presentation module 108 to resume presentation of the content 106 at a slightly early point, such as ten seconds before a previous stop point of the content 106.

The event library 222 may include events 302 and actions 306 which trigger or initiate other actions 306. For example, a sleeping user 302(13) event may result in an action 306(13) of stopping presentation and having the media device 104 enter a low power mode. In other implementations the actions 306 may include providing a notification to other modules in the media device 104 or coupled to the media device 104. For example, the event 302 of the media device 104 falling a particular distance may result in the action 306 of a notification being sent to a maintenance management server.

The event library 222 may be manually generated, such as by the user 102 or by another person. The user interface module 216 may provide a user interface allowing the user to define particular events 302, the input devices used 304 or monitored, and designate the corresponding actions 306.

The event library 222 may also be automatically generated. The event library 222 may be generated using machine learning techniques to analyze input data 220 and subsequent actions taken by the user 102 to build the associations in the event library 222. For example, the event determination module 112 may determine that a correspondence exists between a time of occurrence of a decrease in ambient light level indicated by the light sensor 206(3) and lack of input on the one or more touch sensors 206(6) and subsequent user commands to rewind content to the time of occurrence. The first few times this happens, the content 106 may continue playing until it reaches an end. However, using the machine learning techniques, the event determination module 112 may learn that when the media device 104 has been set down and the room lights turned out, presentation of the content 106 is to be suspended until the user 102 returns.

In some implementations the event library 222 may be generated based on input from many media devices 104. For example, the machine learning techniques may be used on input data 220 acquired from many media devices 104 to determine and build associations between common events 302 and actions 306.

By determining the occurrence of events 302, and taking corresponding actions 306, the user experience may be improved. For example, during presentation of the content 106 the user 102 may set the media device 104 down and walk away. Detecting the event of the user 102 leaving, presentation of the content 106 is paused automatically. Upon the user 102 returning and picking up the media device 104, the presentation may resume. Instead of requiring the user to interact with content controls such as buttons, the user's 102 own actions trigger the actions. As a result, the user 102 interaction with the device is made easier and more natural.

Figure 4:
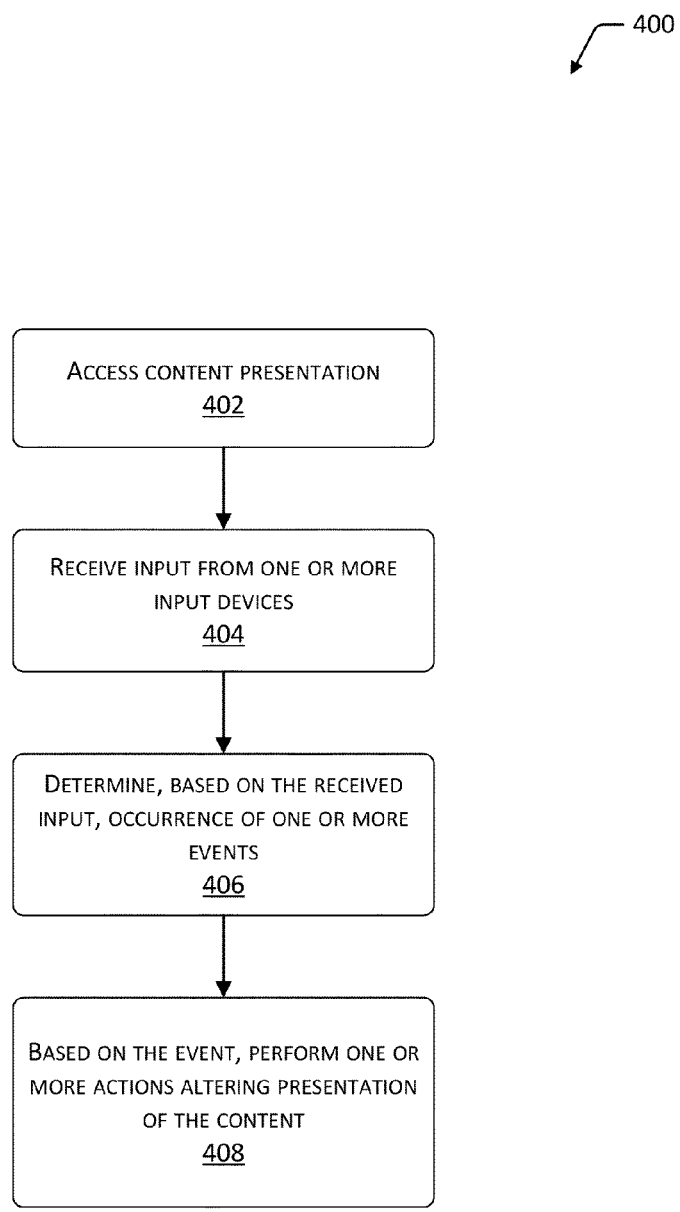
FIG. 4 is a flow diagram of a process of performing one or more actions altering presentation of the content based on one or more events.

FIG. 4 is a flow diagram 400 of a process of performing one or more actions altering presentation of the content 106 based on determination that one or more events 302 have occurred. This process may be implemented at least in part by the content presentation module 108, the event determination module 112, and so forth.

Block 402 accesses at least a portion of content 106. For example, the content presentation module 108 may receive a stream of a portion of the content 106 from a server using the one or more communication interfaces 210.

Block 404 receives input from the one or more input devices 206. For example, the microphones 120 may receive the noise 122. The amplitude or other characteristics of the noise 122 may be above a threshold value. In some implementations, the received input may omit input such as the user 102 activating one or more of the buttons 206(1), the touch sensors 206(6), or both.

Block 406 determines, based on the received input, occurrence of one or more events 302. For example, based on the amplitude of the noise 122 being above the threshold value, the event determination module 112 may determine that an ambient noise detection event 302(1) has occurred. As described above, several events 302 may occur simultaneously, or in close succession. For example, an ambient noise detection event 302(1) and a vertical to horizontal transition 302(2) may occur simultaneously. In another example, a distance event of the user 102 moving away 302(3) may be detected. The user 102 moving away 302(3) may be determined by the ranging sensors 206(4) indicating that the distance between the user 102 and the media device 104 has exceeded a threshold value.

The event determination module 112 may determine occurrence of an event 302 by receiving data from a plurality of sensors and comparing the received data with previously stored data or profiles, such as described above with regard to the event library 222. For example, based on this comparison, the determined events 302 may include determinations that the user 102 is asleep, the user 102 is awake, the user's 102 attention is away from the media device 104, absence of the user 102 relative to the media device 104, presence of more than one user 102 relative to the media device 104, and so forth.

Block 408, based on the one or more events 302, performs one or more actions 306. As described above, in some implementations these actions 306 may be associated with presentation of the content 106, notification of other modules or devices, and so forth. For example, the actions 306 may include beginning presentation of the content 106, suspending presentation of the content 106, stopping presentation of the content 106, rewinding the content 106 a predetermined amount and resuming presentation, decreasing or muting volume of the content 106, initiating the active noise mitigation, and so forth. Continuing the example above, the user moving away 302(3) event may initiate the action 306(3) of suspending presentation of the content 106.

In other implementations the actions 306 may be associated with operations other than presentation of the content 106, such as changing the operating state of the media device 104 to enter a low power mode.

Figure 5:
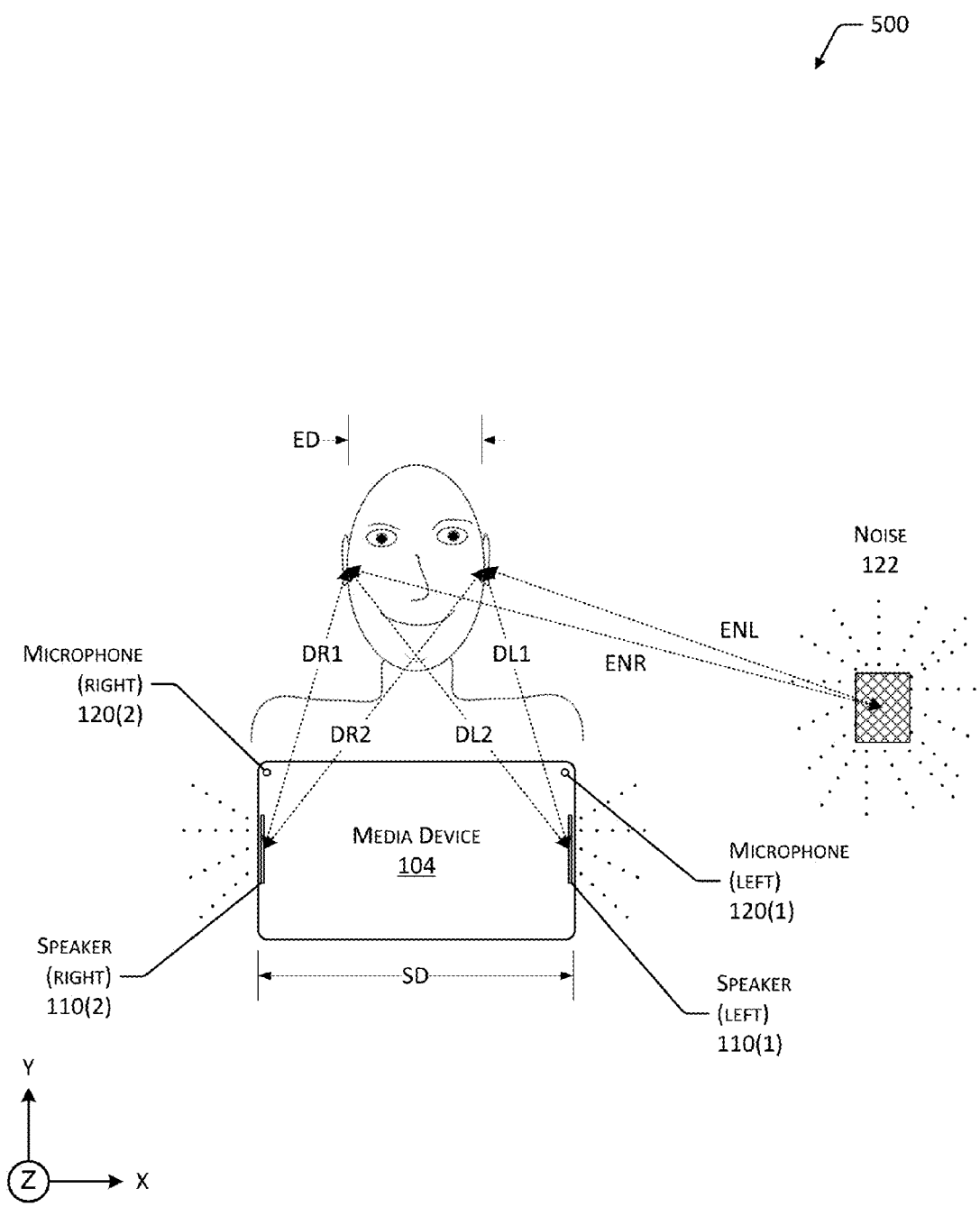
FIG. 5 illustrates various distances which may be used in calculating an anti-noise signal used to provide noise mitigation.

FIG. 5 illustrates various distances 500 which may be used in calculating an anti-noise signal used by the noise mitigation module 116 to mitigate the user's 102 perception of the noise 122.

The noise mitigation module 116 may use information about the position of the user 102 relative to the media device 104, or the one or more speakers 110 coupled thereto, to configure an anti-noise signal which provides the noise mitigation zone 118. In some implementations, the position of the user 102, when proximate to the media device 104, may be assumed to be in front of and facing the media device 104. This assumption may be used to simplify generation of the noise mitigation zone 118.

These distances may be used to determine time-of-flight between the one or more speakers 110 and the user's 102 ears to provide for timing or phase shifts in the anti-noise signal. These distances may include a speaker distance "SD" between two or more speakers 110. In a media device 104 in which the speakers 110 are incorporated or coupled to a chassis, the speakers 110 may be within the device plane 128, or may be within a plane which is coplanar to the device plane 128. An ear distance "ED" between the outer ear canal openings of the user 102 as arranged within the coronal plane 126 is determined. The ED may be used to determine the width of the noise mitigation zone 118.

Other positions may also be used to generate the noise mitigation zone 118. These positions may include a right speaker 110(2) to right ear distance DR1, a right speaker 110(2) to left ear distance DR2, a left speaker 110(1) to left ear distances DL1, a left speaker 110(1) to right ear distance DL2. A distance and direction between the right ear and the noise 122 is designated ENR, while the distance and direction between the left ear and the noise 122 is designated ENL.

In some implementations the one or more speakers 110 may be external to the media device 104. For example, the speakers 110 may be distributed around a space such as in an automobile or home theater. A calibration routine may be used to determine the relative position of the different speakers 110. For example, reference signals may be sent to individual speakers 110, emitted, and detected by a plurality of the microphones 120 to determine bearing and distance. In another implementation the cameras 206(2) may be used to determine the position of the one or more speakers 110.

In some implementations distances to centroids or designated points on the user 102, the media device 104, or both may be used. For example, instead of the distances DR1, DR2, DL1, and DL2 extending from the speakers 110 to the respective out ears, a single centroid of the user's 102 head located at a midpoint between the ears may be used.

Other relative positions may also be determined and used in the generation of the noise mitigation zone 118. For example, distance and direction between the microphones 120 and various points such as the noise 122.

The relative positions including distance, direction, and so forth may be determined by the one or more input devices 206. For example, a plurality of cameras 206(2) may determine the distance and bearing of the user 102 relative to the device. Or the ranging sensors 206(4) may be used to scan for and determine the presence and direction of objects. In some implementations, the bearing or direction of some distances may be assumed, and the distance only may be measured.

In some implementations the noise mitigation module 116 may be configured to generate a plurality of noise mitigation zones 118 each encompassing a different user 102. In another implementation, a single larger noise mitigation zone 118 encompassing a plurality of users 102 may be generated.

Figure 6:
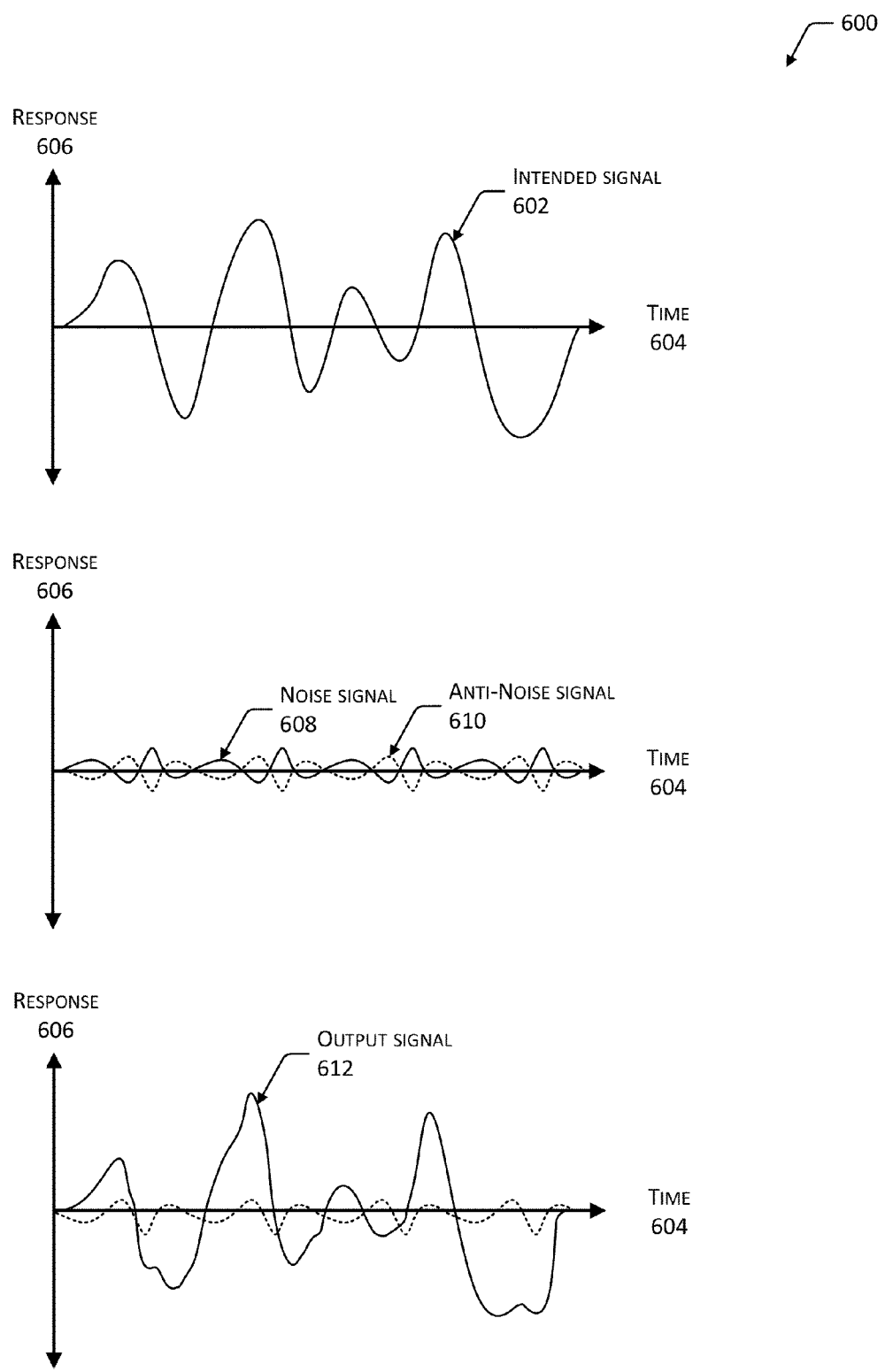
FIG. 6 illustrates an intended signal from content, a noise and anti-noise signal, and an output signal based on the intended signal and the anti-noise signal.

FIG. 6 illustrates signals 600 associated with the noise mitigation. A graph of an intended signal 602 from the content 106 is shown with time 604 indicated along the horizontal or X axis, while response 606 is indicated along the vertical or Y axis. The response 606 may be considered whether a compaction or rarefaction of the air would be generated by a speaker. The intended signal 602 comprises audio information provided by the content 106.

A second graph illustrates a noise signal 608, such as received by the microphones 120 from the noise source 122. The noise signal 608 comprises noise which may be disruptive or distracting to the user 102 during presentation of the content 106. For example, the noise signal 608 may be engine noise while the user 102 uses the media device 104 in an automobile. In some implementations the noise signal 608 may be received by a microphone 120 which is external to the media device 104. Continuing the automotive example, a media device 104 without microphones 120 may connect wirelessly to a communication system within the automobile and use microphones in a hand-free speaker system to acquire the noise signal 608. In yet another implementation, the noise signal 608 may be based on previously acquired knowledge of the environment. For example, information about interior noise characteristics of a particular make and model of automobile may be used in place of the noise signal 608.

The noise mitigation module 116, based at least in part on information about the position of the user 102 relative to the media device 104, generates an anti-noise signal 610. This anti-noise signal 610 may be configured to be about 180 degrees (pi radians) out of phase with the noise signal 608. In some implementations the anti-noise signal 610 may be an inverted version of the noise signal 608. The anti-noise signal 610 may be configured to introduce timing delays to particular portions of the intended signal 602 such that, upon arrival at the noise mitigation zone 118, the resulting sound is close to an inverted-phase of the waves of the noise 122.

The anti-noise signal 610 is configured to, when summed with the noise signal 608 in the noise mitigation zone 118, result in destructive interference to the sound waves associated with the noise signal 122. This destructive interference results in a reduction in the perceived amplitude of the noise 122 in the noise mitigation zone 118.

By using the position information and simplifying assumptions of the user 102 in a two-dimensional space such as distance and bearing relative to the media device 104, the processing used to generate the anti-noise signal 610 is simplified compared to that for the three-dimensional case. In some implementations, the situation may be further simplified by assuming the position of the user 102 is with a range of angles and distances relative to the speakers 110. For example, the user 102 may be assumed to be somewhere within 30 degrees to the left or right of the surface of front surface of the media device 104, and at a distance of between 1 foot and 4 feet. These assumptions may be used to constrain the processing further.

The anti-noise signal 610 is used to modify the intended signal 602 to produce an output signal 612. In one implementation illustrated here, the output signal 612 may be produced by combining or summing the anti-noise signal 610 with an intended signal 602 from the content 106.

In another implementation, the output signal 612 may be used to modify one or more equalizer settings while processing the intended signal 602 from the content 106 such that one or more particular frequency bands are attenuated or amplified. As used herein, the equalizer may include a graphic equalizer, parametric equalizer, and so forth. In one implementation, the equalizer settings may be implemented using one or more digital signal processors.

Once generated, the output signal 612 may be emitted by one or more of the speakers 110. As described above, in some implementations the output signal 612 or portions thereof may be directed to available speakers 110 with particular capabilities, such as high frequency components to a tweeter. Once emitted, at least a portion of the emitted sound travels towards the user 102. Based on the position of the user 102 relative to the speakers 110, the output signal 612 produces a noise mitigation zone 118, while the user 102 is still able to hear the audio portion of the content 106. Using the techniques described, the noise mitigation zone 118 is generated using the same speakers 110 as those used to present the content 106.

Figure 7:
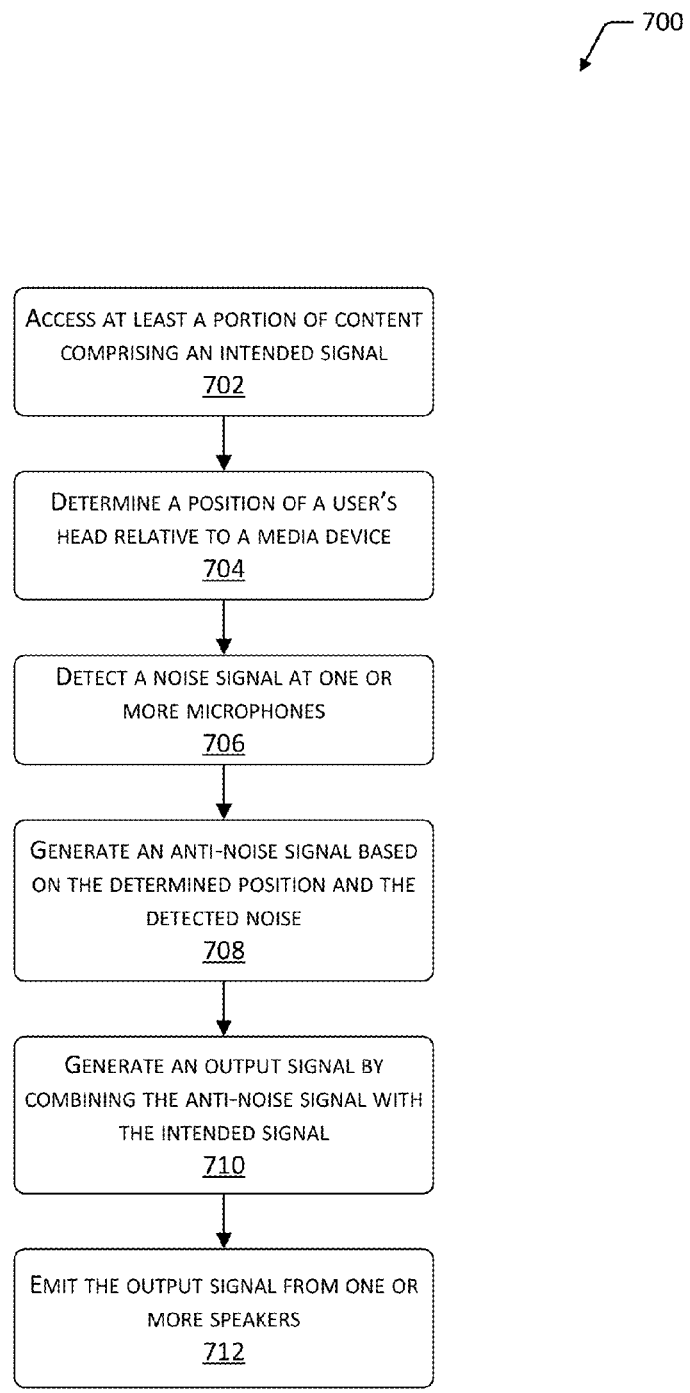
FIG. 7 is a flow diagram of a process of noise mitigation based on combining the anti-noise signal with the intended signal to generate an output signal.

FIG. 7 is a flow diagram 700 of a process of noise mitigation based on summing or otherwise combining the anti-noise signal 610 based on the user's 102 position relative to the media device 104 with the intended signal 602 to generate an output signal 612. This process may be implemented at least in part by the content presentation module 108, the event determination module 112, the noise mitigation module 116, and so forth.

Block 702 accesses at least a portion of content 106. For example, the content presentation module 108 may open a content 106 file previously stored in the datastore 218.

Block 704 determines a position of at least a portion of the user 102 relative to the one or more speakers 110 coupled to the media device 104. This position may be expressed as distance, bearing, or distance and bearing from one or more of the speakers 110. As described above, in one implementation the determination of the position may use the one or more cameras 206(2) to acquire one or more images which are processed to determine distance, bearing, or both. This determination may be made by identifying a disparity in apparent position of one or more features in the one or more images. Correlation of this disparity may be used to determine distance, bearing, or both.

In other implementations, the position may be determined by tracking or locating 3D glasses, smartphones, tablets, watches, wristbands, necklaces, or other devices which may be worn or held by the user 102. These devices may be active in that they emit a signal or passive in that they are interrogated by an external input.

The position may be specified relative to a particular datum or reference point in the media device 104, such as a centroid of the device. The position may indicate the position of the user 102 in two or three dimensions. For example, two dimensional positioning may indicate a distance and angular bearing relative to the centroid. Three dimensional positioning may indicate the distance, angular bearing, and an azimuth/elevation relative to the centroid. In some implementations the position may be specified as a simplified two-dimensional situation, with the bearing fixed at a predetermined value and the distance being variable. This may simplify operation of the noise mitigation module 116 in generating the anti-noise signal 610.

There may be some imprecision in the determination of the position of the user 102. In this implementation, the determined position may be manually adjusted by the user 102 or may be configured to automatically "move". Once the user 102 perceives the noise mitigation zone 118 as being properly placed, that position may be locked. In some implementations the locked position may be configured to track subsequent movements by the user 102, compensating based on the manual input.

Block 706 detects the noise signal 608. For example, the one or more microphones 120 may receive the sound of the engine noise while the media device 104 is in a running vehicle.

Block 708 generates the anti-noise 610 signal based on the determined position of the user 102 and the noise signal 608. As described above, the anti-noise signal 608 is configured to generate the noise mitigation zone 118 proximate to, or encompassing at least a portion of, the head of the user 102.

Block 710 generates the output signal 612 by summing or otherwise combining the anti-noise signal with the intended signal 602 from the content 106. Block 712 emits the output signal 612 from the one or more speakers 110. For example, the output signal 612 may be sent to the one or more speakers 110 for emission.

Figure 8:
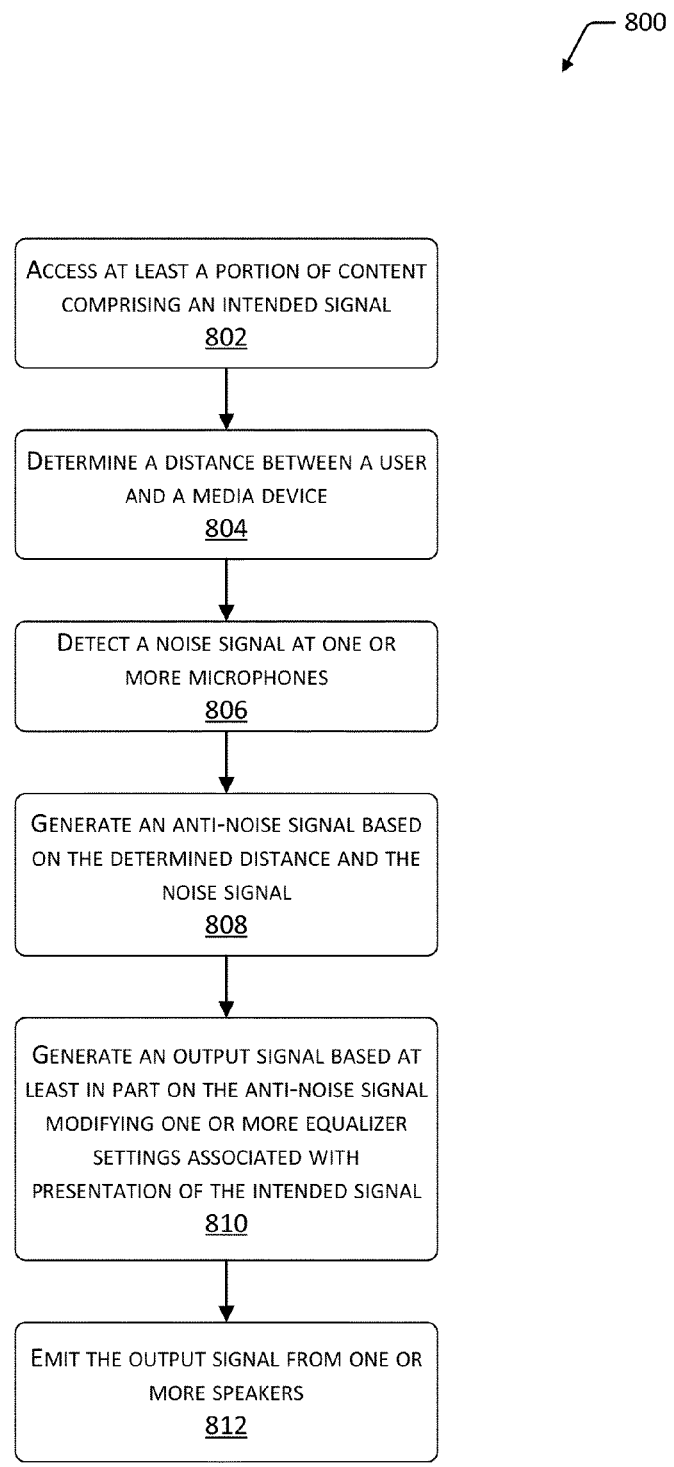
FIG. 8 is a flow diagram of a process of noise mitigation by generating an output signal based at least in part on a distance between the user and the media device and the anti-noise signal to modify of one or more audio equalizer settings.

FIG. 8 is a flow diagram 800 of a process of noise mitigation by generating an output signal 612 based at least in part on a distance between the user 102 and the media device 104 and the anti-noise signal 610. In this process, the anti-noise signal 610 is used to modify of one or more audio equalizer settings.

Block 802 accesses at least a portion of content 106. For example, the content presentation module 108 may receive a radio broadcast of the content 106.

Block 804 determines a distance between at least a portion of the media device 104 and the user 102 based at least in part on data acquired by one or more input devices 206. The one or more input devices 206 may include one or more distance determination devices such as the one or more cameras 206 (2), the ranging sensors 206(4) such as the capacitive proximity sensors, time of flight optical or ultrasonic sensors, and so forth. For example, glasses which are worn by the user 102 to support presentation of 3D images may include a tag, emitter, and so forth which may be used to determine position, distance, or both between the user 102 and the speakers 110.

Block 806 determines a noise event 302 comprising a noise signal 608. The noise signal 608 may be detected by the one or more microphones 120. For example, the microphones 120 may detect the engine noise from the vehicle in which the user 102 has the media device 104.

Block 808 generates the anti-noise signal 610 based on the determined distance and the noise signal 608. As described above, the anti-noise signal may be configured to produce destructive interference to at least a portion of the noise signal 608 at the noise mitigation zone 118 which is proximate to one or both ears of the user 102. In another implementation, the anti-noise signal may be configured to incorporate the noise 122 into the presentation of the content 106.

Block 810, generates an output signal 612 based at least in part on the anti-noise signal 608 modifying one or more equalizer settings associated with presentation of the intended signal 602 of the content 106. The equalizer settings modify the intended signal 602 by attenuating or amplifying a plurality of frequency bands. The intended signal 602, now modified by the equalizer settings, is used to generate the output signal. In another implementation, the modification of the one or more equalizer settings may be made to a signal resulting from the sum or combination of the anti-noise signal 608 and the intended signal 602, as discussed above with respect to block 710 of FIG. 7.

Block 812 emits the output signal from the one or more speakers 110. For example, the output signal 612 may be sent to the one or more speakers 110 for emission. As described above, within the noise mitigation zone 118, the user 102 is able to hear the content 106 and perception of the noise 122 is reduced.

Those having ordinary skill in the art will readily recognize that certain steps or operations illustrated in in the figures above can be eliminated or taken in an alternate order. Moreover, the methods described above may be implemented as one or more software programs for a computer system and are encoded in a computer readable storage medium as instructions executable on one or more processors.

The computer readable storage medium can be any one of an electronic storage medium, a magnetic storage medium, an optical storage medium, a quantum storage medium and so forth. Separate instances of these programs can be executed on or distributed across separate computer systems. Thus, although certain steps have been described as being performed by certain devices, software programs, processes, or entities, this need not be the case and a variety of alternative implementations will be understood by those having ordinary skill in the art.

Additionally, those having ordinary skill in the art readily recognize that the techniques described above can be utilized in a variety of devices, environments and situations.

Although the present disclosure is written with respect to specific embodiments and implementations, various changes and modifications may be suggested to one skilled in the art and it is intended that the present disclosure encompass such changes and modifications that fall within the scope of the appended claims.

What is claimed is:

1. A device, comprising:
one or more microphones;
one or more speakers configured to generate sound;
one or more ranging sensors;
one or more memories storing computer-executable instructions; and
one or more processors configured to access the one or more microphones, the one or more speakers, the one or more ranging sensors, the one or more memories, and execute the computer-executable instructions to:
access at least a portion of content;
determine a distance between at least a portion of the device and a user's head based at least in part on data acquired by the one or more ranging sensors;
determine a noise event comprising at least in part a noise signal received at the one or more microphones;
based on the determined noise event:
generate an anti-noise signal based on the determined distance and the determined noise signal;
modify one or more equalizer settings based at least in part on the anti-noise signal, wherein the one or more equalizer settings are configured to attenuate or amplify signals in a plurality of frequency bands;
generate an output signal comprising an intended signal based on the content, wherein the intended signal is attenuated or amplified in a plurality of frequency bands based on the one or more equalizer settings; and
send the output signal to the one or more speakers.

2. The device of claim 1, wherein the anti-noise signal is configured to produce destructive interference to at least a portion of the sound waves associated with the noise signal in a zone proximate to one or both ears of the user's head.

3. The device of claim 1, wherein the ranging sensor comprises one or more of:
one or more cameras,
a capacitive proximity sensor,
an optical proximity sensor,
an acoustic proximity sensor,
an optical time-of-flight sensor, or
an ultrasonic time-of-flight sensor.

4. The device of claim 1, the instructions further configured to:
present at least a portion of the content;
determine a distance event comprising the determined distance between the user and the device exceeding a threshold value; and
based on the detected distance event, pause presentation of the content.

5. A method implemented by a computerized device, the method comprising:
presenting content using one or more output devices;
receiving input from one or more input devices, the one or more input devices comprising a microphone, a camera, a light sensor, a ranging sensor, or a motion sensor, wherein the received input includes a noise signal;
based on the received input, determining occurrence of one or more events, wherein at least one of the one or more events comprises detection of ambient noise; and
based on the one or more events:

determining a position of at least a portion of a user relative to one or more speakers;

generating an anti-noise signal based on the determined position and the noise signal;

generating an output signal by combining the anti-noise signal with an intended signal based on the content; and sending the output signal to the one or more speakers.

6. The method of claim 5, wherein the determining the position of the user comprises:

processing one or more images acquired by the one or more cameras to identify a disparity in apparent position of one or more features in the one or more images; and correlating this disparity to a distance and bearing.

7. The method of claim 5, wherein the anti-noise signal is configured to produce a noise mitigation zone proximate to a head of the user by generating at least partially destructive interference with sound waves from the noise signal.

8. The method of claim 5, further comprising, based on the occurrence of the one or more events;

modifying one or more equalizer settings such that one or more particular frequency bands of the combined anti-noise signal and the intended signal are attenuated or amplified based at least in part on the anti-noise signal.

9. The method of claim 5, the generating the anti-noise signal further comprising introducing one or more time delays to change timing of presentation of one or more particular portions in the intended signal.

10. The method of claim 5, wherein the output signal as emitted from the one or more speakers is configured to produce destructive interference with at least a portion of sound waves associated with the noise signal proximate to a head of the user such that perceived amplitude of the noise signal at a head of the user is reduced.

11. The method of claim 5, the one or more events further comprising one or more of:

changing orientation of the computerized device, motion of the computerized device, detecting a human head facing towards or away from the computerized device or a portion thereof, detecting a gaze of a user directed towards or away from the computerized device or a portion thereof; or light level below a threshold.

12. The method of claim 11, further comprising:

based on the one or more events, performing one or more of:

pausing presentation of the content;

stopping presentation of the content;

rewinding presentation of the content;

resuming presentation of the content;

generating a mark indicative of a position within the content corresponding to a time of occurrence of the one or more events; or decreasing volume or muting presentation by the one or more speakers.

13. A portable device, comprising:

one or more input devices comprising one or more of a microphone, a camera, a light sensor, a ranging sensor, or a motion sensor;

one or more output devices;

one or more memories storing computer-executable instructions; and one or more processors configured to access the one or more input devices, the one or more output devices, and execute the computer-executable instructions to:

access at least a portion of content;

receive input from the one or more input devices;

determine, based on the received input, occurrence of one or more events; and based on the one or more events:

determine a distance between at least a portion of the device and a user based at least in part on data acquired by the one or more input devices;

detect, with the one or more input devices, a noise signal;

generate an anti-noise signal based on the determined distance and the noise signal;

generate an output signal comprising an intended signal based on the content and the anti-noise signal; and send the output signal to the one or more speakers.

14. The device of claim 13, wherein the ranging sensor comprises one or more of:

an optical time-of-flight sensor configured to determine distance to at least a portion of a user, or an ultrasonic distance sensor configured to determine distance to at least a portion of the user.

15. The device of claim 13, wherein the determination of the occurrence of one or more events comprises instructions to:

compare at least a portion of the received input with previously stored data, the one or more events comprising:

a user asleep, the user awake, the user's attention away from the device, absence of the user relative to the device, presence of more than one user relative to the device, or presence of ambient noise.

16. The device of claim 13, wherein the one or more processors execute the computer-executable instructions to:

based on the one or more events, perform one or more of:

beginning presentation of the content, pausing presentation of the content, stopping presentation of the content, rewinding the content a predetermined amount and resuming presentation, generating a mark indicative of a position within the content corresponding to a time of occurrence of the event, or decreasing volume of the content.

17. The device of claim 13, wherein the generation of the anti-noise signal comprises introduction of one or more time delays to change timing of presentation of one or more particular portions in the intended signal.

18. The device of claim 13, further comprising a chassis mechanically supporting the one or more input devices, the one or more output devices, the one or more memories, and the one or more processors.

19. The device of claim 13, wherein the one or more processors execute the computer-executable instructions to:

modify one or more equalizer settings based at least in part on the anti-noise signal.

20. The device of claim 13, wherein the one or more processors execute the computer-executable instructions to:

process one or more images acquired by the camera to determine the distance between at least a portion of the device and the user.

* * * * *